United States Patent
Quitoriano et al.

(10) Patent No.: US 7,474,811 B1
(45) Date of Patent: Jan. 6, 2009

(54) NANOWIRE PHOTONIC APPARATUS EMPLOYING OPTICAL FIELD CONFINEMENT

(75) Inventors: Nathaniel J. Quitoriano, Pacifica, CA (US); Marco Fiorentino, Mountain View, CA (US); Theodore I. Kamins, Palo Alto, CA (US); David A. Fattal, Mountain View, CA (US); Hans S. Cho, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/856,007

(22) Filed: Sep. 14, 2007

(51) Int. Cl.
*G02B 6/00* (2006.01)
(52) U.S. Cl. .......................... 385/2; 385/129
(58) Field of Classification Search ............ 385/2, 385/129
See application file for complete search history.

(56) References Cited

U.S. PATENT DOCUMENTS

| | | | | |
|---|---|---|---|---|
| 5,332,910 | A * | 7/1994 | Haraguchi et al. | 257/13 |
| 7,224,854 | B2 * | 5/2007 | Ellwood, Jr. | 385/11 |
| 7,352,942 | B2 | 4/2008 | Feng et al. | |
| 2003/0047739 | A1 * | 3/2003 | Lindstrom et al. | 257/79 |
| 2004/0062505 | A1 * | 4/2004 | Sugitatsu et al. | 385/131 |
| 2005/0191774 | A1 * | 9/2005 | Li et al. | 438/22 |
| 2005/0201655 | A1 * | 9/2005 | Ellwood, Jr. | 385/11 |
| 2006/0228074 | A1 | 10/2006 | Lipson et al. | |
| 2007/0114628 | A1 * | 5/2007 | Barrios et al. | 257/432 |
| 2007/0252132 | A1 * | 11/2007 | Kamins et al. | 257/13 |
| 2007/0257859 | A1 * | 11/2007 | Lashmore et al. | 343/897 |

OTHER PUBLICATIONS

V. R. Almeida et al., "Guiding and confining light in void nanostructure," Optics Letters, Jun. 2004, vol. 29, No. 11, pp. 1209-1211.
C. A. Barrios, "Electrically driven silicon resonant light emitting device based on slot-waveguide," Optics Express, Dec. 2005, vol. 13, No. 25, pp. 10092-10101.
W. Bogaerts et al., "Basic structures for photonic integrated circuits in Silicon-on-insulator," Optics Express, Apr. 2004, vol. 12, No. 8, pp. 1583-1591.
X. Duan et al., "Single-nanowire electrically driven lasers," Nature, Jan. 2003, vol. 421, pp. 241-245.
A. W. Fang et al., "Electrically pumped hybrid AlGaInAs-silicon evanescent laser", Optics Express, Oct. 2006, vol. 14, No. 20, pp. 9203-9210.
H. Rong et al., "Monolithic integrated Raman silicon laser," Optics Express, Jul. 2006, vol. 14, No. 15, pp. 6705-6712.
P. Anderson et al., "High confinement in silicon slot waveguides with sharp bends," Optics Express, Oct. 2006, vol. 14, No. 20, pp. 9197-9202.

* cited by examiner

*Primary Examiner*—James P Hughes (57) ABSTRACT

A photonic apparatus and system employ a plurality of nanowires distributed in a low-index optical waveguide. The plurality of nanowires collectively one or more of produces, enhances, modulates and detects an optical field. The low-index optical waveguide confines the optical field in a vicinity of the plurality of nanowires. The photonic system includes a circuit to one or more of electrically bias the plurality of nanowires and collect electrons produced in the plurality of nanowires.

21 Claims, 8 Drawing Sheets

NANOWIRE PHOTONIC APPARATUS EMPLOYING OPTICAL FIELD CONFINEMENT

CROSS-REFERENCE TO RELATED APPLICATIONS

N/A

STATEMENT REGARDING FEDERALLY SPONSORED RESEARCH OR DEVELOPMENT

N/A

BACKGROUND

1. Technical Field

The invention relates to photonic devices. In particular, the invention relates to nanowire-based photonic devices using optical waveguides.

2. Description of Related Art

Photonic devices such as, but not limited to, lasers and optical detectors are being employed in an increasing number of subsystems and systems. Of particular interest is the integration of such photonic devices with other active and passive circuit components. Integration includes not only the interconnection or coupling of photonic devices with other devices and circuit elements but also the fabrication of photonic devices on or within a substrate that supports other integrated circuit components. As such, there is a keen interest in photonic structures that are readily integrated with other circuit elements in larger, multifunctional integrated circuits. In addition, fabrication costs of such integrated photonic devices are necessarily of particular interest.

BRIEF SUMMARY

In some embodiments of the present invention, a photonic apparatus is provided. The photonic apparatus comprises a low-index optical waveguide having a confined region. The photonic apparatus further comprises a plurality of nanowires. The nanowires are distributed within the confined region. The plurality of nanowires is distributed to collectively one or more of produce, enhance, modulate and detect an optical field. The low-index optical waveguide confines the optical field in the confined region.

In other embodiments of the present invention, a photonic system is provided. The photonic system comprises a low-index optical waveguide having a confined region. The low-index optical waveguide confines an optical field in the confined region. The photonic system further comprises a plurality of nanowires distributed within the confined region of the low-index optical waveguide. The photonic system further comprises a circuit that one or both of electrically biases the plurality of nanowires and collects electrons produced by the plurality of nanowires. The circuit facilitates one or more of production, enhancement, modulation and detection of the optical field by the plurality of nanowires.

In other embodiments of the present invention, a photonic apparatus is provided. The photonic apparatus comprises a plurality of nanowires, the nanowires comprising a semiconductor. The photonic apparatus further comprises means for confining an optical field. The means for confining an optical field confines an optical mode of the optical field in a vicinity of the plurality of nanowires.

Certain embodiments of the present invention have other features that are one or both of in addition to and in lieu of the features described hereinabove. These and other features of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Embodiments of the present invention provide a photonic apparatus and a photonic system that employs the photonic apparatus to operate on an optical signal. The photonic apparatus confines and concentrates an optical field of the optical signal in a vicinity of a plurality of nanowires. By concentrating the optical field, the plurality of nanowires may interact more efficiently with the optical field. Moreover, the confined optical field may facilitate the plurality of nanowires to act in a constructive and cooperative manner to influence the optical field. In some embodiments, the photonic apparatus one or more of generates, enhances, and modulates the optical field to produce an optical signal. In other embodiments, the photonic apparatus detects the optical field of an incident optical signal.

In particular, according to various embodiments of the present invention, the nanowires of the plurality, typically under an electrical bias, function together with means for confining an optical field to influence the confined optical field. For example, the plurality of nanowires may provide light amplification through stimulated emission to one or more of generate and enhance the optical field within the photonic apparatus. In such an exemplary embodiment, the photonic apparatus may be a laser, for example. In other embodiments, the electrically biased plurality of nanowires acts in concert to absorb photons and transform the optical signal into an electrical signal. In such an example, the photonic apparatus is an optical detector that detects the optical signal. In other embodiments, the electronic bands and the occupancy of the energy bands of the material that constitutes the plurality of nanowires is modified by applying an electrical signal in order to change the absorption of the optical signal. In such example, the photonic apparatus is an optical modulator that modulates the optical signal.

According to various embodiments herein, the photonic apparatus may be realized in a relatively compact and space-efficient form factor. Moreover, the photonic apparatus may be readily fabricated in an integrated form as part of a larger circuit or photonic system. In particular, according to various embodiments of the present invention, the photonic apparatus is well-suited to fabrication on or in a substrate such as, but not limited to, a multilayer semiconductor substrate. Fabrication on or in the substrate facilitates integrating the photonic apparatus with other photonic and non-photonic components including, but not limited to, one or more of passive photonic components, active photonic components, passive electronic components and active electronic components.

For example, the photonic apparatus may be fabricated directly in a surface layer (e.g., a thin film semiconductor layer) of a semiconductor-on-insulator (SOI) substrate. The surface layer may be a single-crystal silicon, an amorphous silicon, or a polysilicon thin film layer of a silicon-on-insulator substrate, for example. Other photonic components similarly may be fabricated on or in the same semiconductor substrate and integrated with the photonic apparatus, according to some embodiments of the present invention. Such photonic components that may be integrated with the photonic apparatus include, but are not limited to, optical signal transmission structures (e.g., other optical waveguides), optical amplifiers, optical switches and optical modulators.

According to various embodiments, the photonic apparatus comprises a plurality of nanowires and a means for confining an optical field of an optical signal, or more precisely an optical mode of the optical field, in a vicinity of the nanowires. In some embodiments, the means for confining comprise an optical waveguide. The optical waveguide characteristically includes a guiding structure or element. As used herein, the 'guiding structure or element' refers to a portion of an optical waveguide in which a majority of the optical field of the optical signal is concentrated (i.e., guided).

In some of such embodiments, the optical waveguide comprises a low-index optical waveguide. Herein, a 'low-index optical waveguide' is defined as an optical waveguide having a region in which a refractive index is relatively lower than a refractive index of a surrounding region. The region with the relatively lower index of refraction is referred to as a 'low index region'. Moreover, a majority of an optical field propagating in the low-index optical waveguide is essentially confined to the low index region. The low-index optical waveguide is distinguished from a conventional or high-index optical waveguide (e.g., a fiber optic waveguide) in that the high-index optical waveguide includes a guiding structure made exclusively of material having a higher refractive index than the surrounding material. In some exemplary embodiments, the low-index optical waveguide is a slot optical waveguide. In other exemplary embodiments, the low-index optical waveguide uses a photonic bandgap crystal adjacent to the low index region to confine the optical field propagating within the optical waveguide.

As used herein, 'slot optical waveguide' refers to a low-index optical waveguide, as defined herein, comprising a sub-micron, low refractive index slot bounded by a pair of walls having a relatively higher index of refraction. Specifically, the slot has a refractive index that is less than, and in some embodiments much less than, a refractive index of a material of the walls. For example, a refractive index of the slot may be about 1.0 (e.g., air) while the walls may have a refractive index of about 3.6 (e.g., silicon). As such, the slot may be referred to as a 'low refractive index slot' or 'low-index' slot while the walls are often referred to as 'high refractive index walls' or 'high-index' walls. The slot optical waveguide is also referred to as simply a 'slot waveguide' herein. Furthermore, the slot waveguide is a representative embodiment of a low-index optical waveguide. As such, the terms 'slot waveguide' and 'low-index optical waveguide' are generally used interchangeably herein unless a distinction is necessary for proper understanding.

Operation of the slot optical waveguide may be understood as a mode construction of two 'high-index' optical waveguide modes of an optical signal propagating in the high refractive index walls that bound the low refractive index slot. In particular, a high contrast discontinuity in an electric field of the optical signal is created at an interface between the low refractive index slot and the high refractive index walls. A quasi-transverse electric (TE) mode of the optical signal propagating through the slot optical waveguide structure experiences a discontinuity that is proportional to the square of the ratio of the high refractive index of the walls and the low refractive index of the slot. When a width of the slot is comparable to a decay length of the electric field, the high contrast discontinuity produces a relatively strong overlap of the two high-index waveguide modes within the slot. The strong overlap results in a power density of the field within the low refractive index slot that is relatively constant across the slot and is much higher than the field within the high refractive index walls. As such, the optical signal is tightly confined to the slot of the slot waveguide. Moreover, the optical field intensity of the optical signal within the slot represents a high intensity region relative to the optical field intensity in an area surrounding the slot.

In various embodiments, a particular width of the slot depends, in part, on a refractive index of a material of the walls and a refractive index of the slot region of the slot waveguide. For example, a slot waveguide having walls comprising silicon (Si) and having a slot that is essentially filled with air or another relatively low refractive index material such as, but not limited to, silicon dioxide ($SiO_2$), may have a slot width on the order of about 50 nanometers (nm) to about 100 nm. Generally, a slot width of less than about 200 nm may be employed for a wide variety of practical materials. Additional details regarding slot optical waveguide design and operation are provide by Lipson et al., U.S. Patent Application Publication 2006/0228074 A1, and Barrios et al., U.S. Patent Application Publication 2007/0114628 A1, both of which are incorporated by reference herein. In addition to the slot waveguide described above, essentially any optical waveguide that confines the optical field of the optical signal to a vicinity of the plurality of nanowires may be employed according to the present invention without departing from the intended scope thereof.

In some embodiments, the optical waveguide and the plurality of nanowires are arranged as an optical resonator. For example, a segment of the low-index optical waveguide (e.g., slot waveguide) containing the plurality of nanowires may be located between a pair of mirrors to produce a Fabry-Perot resonator. In another example, the optical resonator may be realized as a ring resonator in which one or more segments of the low-index optical waveguide are arranged in closed loop. In some of such embodiments, the optical resonator may be referred to as a 'folded cavity' resonator because mirrors are employed along (as opposed to at the ends of) an optical path within the optical resonator. In particular, mirrors may be employed to introduce an abrupt change in a direction of the propagating signal within the optical resonator. In other words, an optical path within the resonator is effectively 'folded' by a presence of the mirror. In some embodiments, the mirrors allow the optical resonator to be realized in a more compact and space-efficient shape than would be possible otherwise. Total internal reflection mirrors may be employed to realize the folded cavity of the optical resonator, according to some embodiments.

A total internal reflection mirror (TIR mirror) is defined as a mirror that reflects or changes a direction of an optical signal using total internal reflection. Total internal reflection is a well-known optical phenomenon. Total internal reflection of an optical signal traveling in a material occurs when the optical signal encounters a material boundary at an angle greater than a critical angle relative to a normal of the boundary. In particular, when the material boundary represents a change in refractive index from a higher refractive index to a lower refractive index, the optical signal beyond the critical angle will be essentially unable to penetrate the boundary and will be reflected away from the boundary. The reflection obeys the law of reflection in that a reflection angle equals an angle of incidence on the boundary. An example of a boundary that may provide total internal reflection and thus, be employed as a TIR mirror, is a boundary between a dielectric material (e.g., glass or silicon) and air.

The term 'nanowire' as employed herein is defined as an individual quasi-one dimensional, nano-scale, often single crystalline structure typically characterized as having two spatial dimensions or directions that are much less than a third spatial dimension or direction. The presence of the third, greater dimension in nanowires facilitates electron wave functions along that dimension while conduction is limited in the other two spatial dimensions. Moreover, a nanowire, as defined herein, generally has an axial length (as a major or third spatial dimension), opposite ends and a solid core. A nanowire also may be referred to as a nanowhisker, nanorod or a nanoneedle.

Nanowires may be formed according to a variety of methodologies. For example, nanowires may be formed by filling a mold comprising nano-scale holes with a material of the nanowires. In particular, a mold or mask having holes is formed on a surface. The holes are then filled with a material that will become the nanowire. In some cases, the mold is removed to leave free-standing nanowires. In other instances, the mold (e.g., $SiO_2$) may remain. In another example, nanowires are grown in place.

Nanowires may be grown using a variety of techniques. For example, catalyzed growth includes, but is not limited to, metal-catalyzed growth using one or more of a vapor-liquid-solid VLS technique and a vapor-solid VS technique, for example. A nanoparticle catalyst is formed on a surface from which the nanowire is to be grown. The growth may be performed in a chemical vapor deposition (CVD) chamber, for example, using a gas mixture comprising precursor nanowire materials and the assistance of the nanoparticle catalyst.

In particular, the nanoparticle catalyst accelerates decomposition of the precursor nanowire material in the gas mixture, such that adatoms resulting from decomposition of a particular nanowire material-containing gas diffuse through or around the nanoparticle catalyst, and the adatoms precipitate on the underlying substrate. The adatoms of the nanowire material precipitate between the nanoparticle catalyst and the surface to initiate nanowire growth. Moreover, catalyzed growth of the nanowire is continued with continued precipitation at the nanoparticle-nanowire interface. Such continued precipitation causes the nanoparticle to remain at the tip of the free end of the growing nanowire. The nanowire growth is continued until a targeted nanowire length is achieved. Other techniques, such as laser ablation for example, also may be used to supply the material forming the growing nanowire.

During catalytic growth, nanowires may grow from the location of the nanoparticle catalyst in a predominately perpendicular direction to a plane of a suitably oriented substrate surface. Under the most common growth conditions, nanowires grow in <111> directions with respect to a crystal lattice and therefore, grow predominately perpendicular to a (111) surface (of a crystal lattice). For (111)-oriented horizontal surfaces, a nanowire will grow predominately vertically relative to the horizontal surface. On (111)-oriented vertical surfaces, a nanowire will grow predominately laterally (i.e., horizontally) relative to the vertical surface.

The use of brackets '[ ]' herein in conjunction with such numbers as '111' and '110' pertains to a direction or orientation of a crystal lattice and is intended to include directions '< >' within its scope, for simplicity herein. The use of parenthesis '( )' herein with respect to such numbers as '111' and '110' pertains to a plane or a planar surface of a crystal lattice and is intended to include planes '{ }' within its scope for simplicity herein. Such uses are intended to follow common crystallographic nomenclature known in the art.

The terms 'semiconductor' and 'semiconductor materials' as used herein independently include, but are not limited to, group IV, group III-V and group II-VI semiconductor materials, including compound semiconductor materials, from the Periodic Table of the Elements, or another semiconductor material that forms any crystal orientation. For example, and not by way of limitation, a semiconductor substrate may be a silicon-on-insulator (SOI) wafer with a (111)-oriented silicon layer (i.e., top layer), or a single, free-standing wafer of (111) silicon, depending on the embodiment. The semiconductor materials that are rendered electrically conductive, according to some embodiments herein, are doped with a dopant material to impart a targeted amount of electrical conductivity (and possibly other characteristics) depending on the nanowire-based device application.

An insulator or an insulator material useful for the various embodiments of the invention is any material that is capable of being made insulating including, but not limited to, a semiconductor material from the groups listed above, another semiconductor material, and an inherently insulating material. Moreover, the insulator material may be an oxide, a carbide, a nitride or an oxynitride of any of those semiconductor materials such that insulating properties of the material are facilitated. Alternatively, the insulator may comprise an oxide, a carbide, a nitride or an oxynitride of a metal (e.g., aluminum oxide) or even a combination of multiple, different insulating materials.

For simplicity herein, no distinction is made between a substrate and any layer or structure on the substrate unless such a distinction is necessary for proper understanding. Additionally, all waveguides described herein are optical waveguides so that omission of the term 'optical' when referring to a 'waveguide' does not change the intended meaning of that being described. Further, as used herein, the article 'a' is intended to have its ordinary meaning in the patent arts, namely 'one or more'. For example, 'a segment' means one or more segments and as such, 'the segment' means 'the segment(s)' herein. Also, any reference herein to 'top', 'bottom', 'upper', 'lower', 'up', 'down', 'left' or 'right' is not intended to be a limitation herein. Moreover, examples herein are intended to be illustrative only and are presented for discussion purposes and not by way of limitation.

Figure 1A:
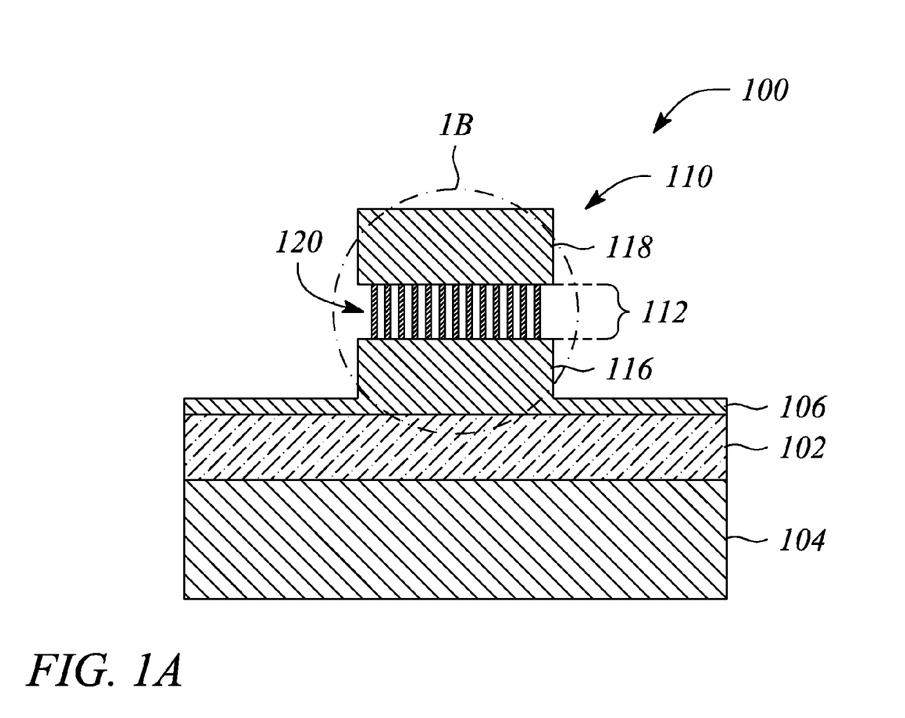
FIG. 1A illustrates a cross sectional view of a photonic apparatus according to an embodiment of the present invention.

FIG. 1A illustrates a cross sectional view of a photonic apparatus 100 according to an embodiment of the present invention. The photonic apparatus 100 is illustrated as employing a low-index optical waveguide fabricated on a semiconductor-on-insulator (SOI) substrate. The SOI substrate comprises an insulator layer 102 overlying a substrate layer 104. A semiconductor layer forms a top layer 106 of the SOI substrate, as illustrated. For example, the SOI substrate may comprise a silicon (Si) substrate layer 104 with a silicon dioxide ($SiO_2$) insulator layer 102 and a Si top layer 106. In various embodiments, additional elements of the photonic apparatus 100 may be formed or fabricated in or from the semiconductor layer 106.

While described herein with reference to an exemplary embodiment employing an SOI substrate comprising a substrate layer 104, insulator layer 102 and top layer 106, the photonic apparatus 100 may be readily fabricated using a variety of other substrates. For example, the SOI substrate may omit the substrate layer and comprise only an insulator and a semiconductor layer on top of the insulator (e.g., silicon on sapphire). In such an SOI substrate, the insulating layer essentially extends through an entire thickness of the substrate except for the top layer. In another example, the insulator is not an oxide but is another insulating material. In yet another example, the substrate does not include an insulator layer at all (e.g., a semiconductor substrate).

Figure 1B:
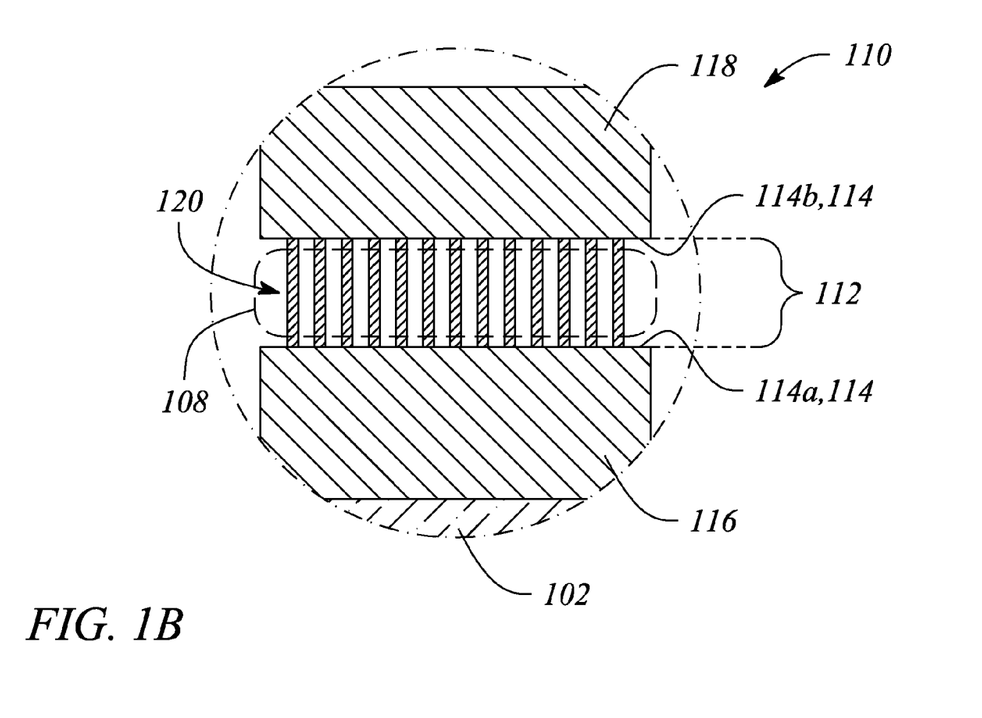
FIG. 1B illustrates a magnified cross sectional view of a portion of the photonic apparatus illustrated in FIG. 1A, according to an embodiment of the present invention.
Figure 1C:
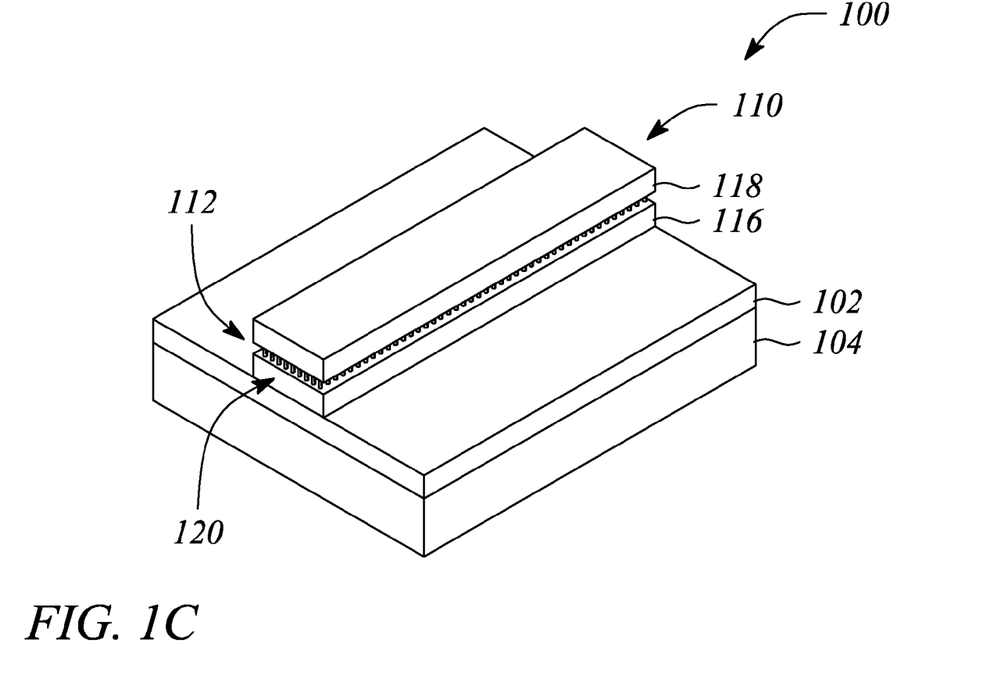
FIG. 1C illustrates a perspective view of a photonic apparatus, according to another embodiment of the present invention.

FIG. 1B illustrates a magnified cross sectional view of a portion of the photonic apparatus 100 illustrated in FIG. 1A, according to an embodiment of the present invention. A dashed line 108 in FIG. 1B illustrates an approximate region of high (e.g., highest) optical field intensity of an optical field confined within the photonic apparatus 100. FIG. 1C illustrates a perspective view of a photonic apparatus 100, according to another embodiment of the present invention. In some embodiments (not illustrated), a substrate other than the illustrated SOI substrate is employed.

The embodiments of the photonic apparatus 100 illustrated in FIGS. 1A-1C comprise a low-index optical waveguide as defined herein and exemplified by a slot waveguide 110. The slot waveguide 110 comprises slot or slot region 112 formed by and between a pair of walls 114 that are spaced apart from one another. The slot region 112 is essentially a guide region 112 of the slot waveguide 110 where an optical field is confined (i.e., a confined region 112).

As illustrated, the slot waveguide 110 is a horizontally oriented slot waveguide 110 in that the spaced-apart walls 114 are both roughly parallel with a surface of the substrate (e.g., a surface of the insulator layer 102) such that the slot 112 is a horizontal slot. In particular, as illustrated, a first wall 114a of the pair of walls 114 is a top surface of a first strip 116 adjacent to the insulating layer 102. A second wall 114b of the pair of walls 114 is a bottom surface of a second strip 118 that is spaced apart from the first strip 116 to form the slot region 112. The strips 116, 118 have a width (horizontal dimension as illustrated) and height (vertical dimension as illustrated) represented by the illustrated rectangular cross section and a length (e.g., as illustrated for the embodiment of FIG. 1C) that is generally longer than either the width or the height. The first strip 116 may be formed (e.g., by etching) from the top layer 106, in some embodiments.

In some embodiments, a material of the walls 114 is a semiconductor material having a relatively high refractive index compared to a refractive index of the slot region 112. In some embodiments, the semiconductor material has an indirect band gap. For example, the strips 116, 118 may comprise a semiconductor material such as, but not limited to silicon (Si), where the Si may take the form of one or more of single crystalline Si, polycrystalline Si (polysilicon or poly-Si) and amorphous silicon (a-Si). In another example, the strips 116, 118 may comprise germanium (Ge). In other embodiments, the strips 116, 118 comprise a compound semiconductor such as, but not limited to, gallium arsenide (GaAs), gallium aluminum arsenide (GaAlAs), indium phosphide (InP), or essentially any other III-V compound semiconductor or II-VI compound semiconductor.

Moreover, a semiconductor material of the first wall 114a (e.g., the first strip 116) may differ from a semiconductor material of the second wall 114b (e.g., the second strip 118). For example, the first strip 116 may comprise single crystalline silicon while the second strip 118 may comprise amorphous silicon (a-Si). In another example, the first strip 116 may comprise GaAs while the second strip 118 comprises GaAlAs. In some embodiments, one or both of the strips 116, 118 may comprise a plurality of layers of different materials (not illustrated). For example, the first strip 116 may comprise a first layer that is GaAs and second layer that is GaAlAs. Multiple layers of differing materials may facilitate realizing a heterostructure semiconductor junction as part of the photonic apparatus 100, for example.

In some embodiments, the slot region 112 separates the walls 114 by less than about several hundred nanometers. For example, a width of the slot 112 may be less than about 200 nm. In another example, the width of the slot 112 is between about 50 nm to about 100 nm. As was discussed above, a particular width of the slot 112 depends, in part, on the relative refractive indices of the walls 114 and the slot region 112.

The embodiments of the photonic apparatus 100 illustrated in FIGS. 1A-1C further comprise a plurality of nanowires 120 distributed within the slot waveguide 110. In particular, the plurality of nanowires 120 is located within the slot region 112 of the slot waveguide 110. The plurality of nanowires 120 is generally positioned to actively and collectively one or more of produce, enhance, modulate, and detect the optical field in the slot region 112, according to various embodiments.

In various embodiments described here and below, there may be other nanowires associated with the photonic apparatus 100 that are in addition to those of the plurality of nanowires 120. For simplicity of discussion, reference to the additional nanowires in the embodiments herein is omitted.

As illustrated in FIGS. 1A-1C, the plurality of nanowires 120 bridges the slot 112 from the first wall 114a to the second wall 114b. That is, first ends of the nanowires 120 are connected to the first wall 114a while respective second ends are connected to the second wall 114b. The connection is one or more of a mechanical connection and an electrical connection, according to various embodiments. Bridging the slot 112 both preferentially locates the plurality of nanowires 120 in a high optical field region (e.g., high field intensity region) of the slot 112 and provides for electrically connecting the plurality of nanowires 120 in an electrical bias circuit or another similar circuit (not illustrated in FIGS. 1A-1C), for example.

According to various embodiments, the nanowires 120 comprise a semiconductor material. In some embodiments, the semiconductor material of the nanowires 120 is essentially similar to that of one or both of the walls 114. For example, the first and second strips 116, 118, and hence the walls 114, as well as the nanowires 120 may comprise GaAs.

In other embodiments, a semiconductor material of the nanowires 120 differs from the semiconductor material of one or both of the walls 114. The walls 114 may comprise Si while the plurality of nanowires 120 may comprise a compound semiconductor such as, but not limited to, GaAs, GaAlAs, and InP, for example. Moreover, the nanowires 120 may comprise one or both of a plurality of axial segments and a plurality of coaxial layers of differing materials, according to some embodiments. For example, a nanowire may comprise an axial segment of GaAlAs at a first end, an axial segment of GaAs in a middle region and another axial segment of GaAlAs at a second end. In another example, the nanowires 120 may comprise a central core of one material surrounded by one or more coaxial layers or shells of other materials. Such multilayer nanowires 120 are often referred to herein as comprising a 'core-shell' structure.

In some embodiments, an interstitial space between and surrounding the plurality of nanowires 120 is essentially unfilled or empty. By 'empty' it is meant that the interstitial space between the nanowires 120 comprises either an ambient fluid or a vacuum if no ambient fluid is present. For example, the ambient fluid may be air surrounding the photonic apparatus 100. The air flows into and occupies the interstitial space only when the photonic apparatus 100 is exposed to the air of a surrounding environment (i.e., the ambient fluid is provided by the surrounding environment).

In other embodiments, the interstitial space is essentially filled with a material other than an ambient fluid. In particular, material within the interstitial space may comprise an optically transmissive insulator material. In such embodiments, the insulator material of the slot region 112 may provide support to the second strip 118 one or both of during and after manufacturing. For example, the slot region 112 may comprise (e.g., be essentially filled with) an insulating, relatively lower refractive index, dielectric material such as, but not limited to, a relatively low index of refraction, optically transmissive oxide (e.g., $SiO_2$), nitride or carbide. The oxide may be grown or otherwise deposited in the slot region 112 prior to depositing a material of the second strip 118, for example.

In some embodiments, only a portion of the interstitial space is filled with an insulating material while a remainder of the interstitial space is essentially empty. For example, the insulator material may fill only a portion of the interstitial space in a vicinity of a semiconductor junction of the nanowires 120. In another example, a portion of the interstitial space in a middle of the slot region 112 is filled with the insulator material while a portion adjacent to one or both of the walls 114 is empty. The converse may be true in another example in which the interstitial space in the middle of the slot region 112 is empty and the insulator material occupies portions of the slot region 112 adjacent to the walls 114. In yet another example, the insulating material may fill a portion of the interstitial space around some of the nanowires 120 while another portion of the interstitial space around other nanowires 120 is essentially empty.

Figure 2A:
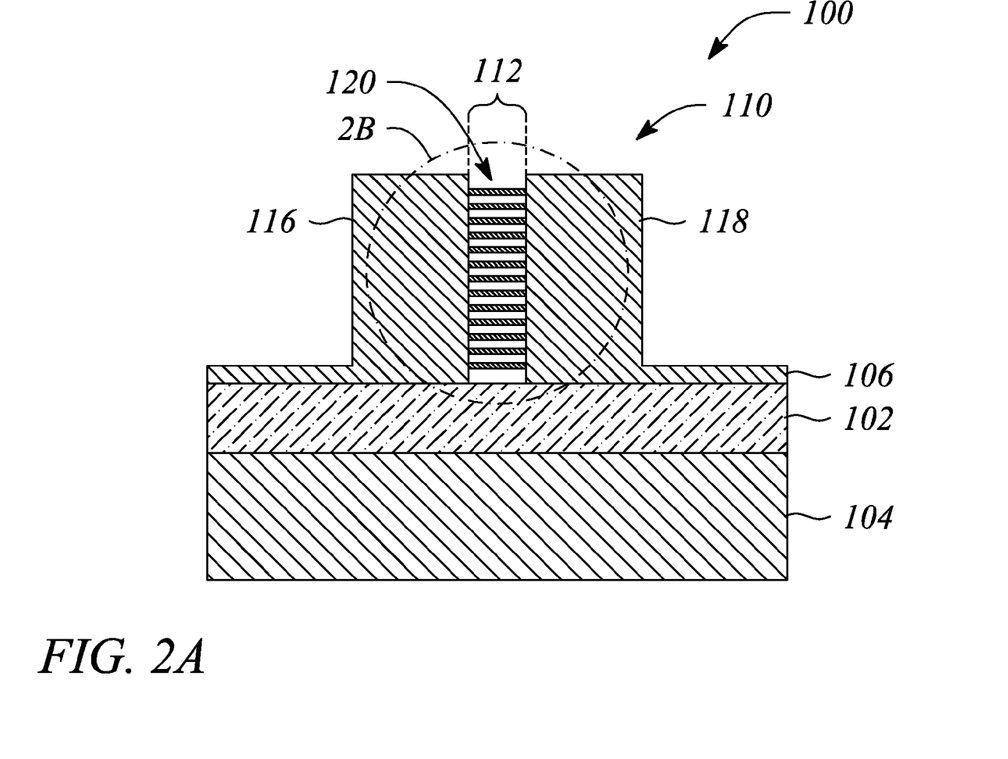
FIG. 2A illustrates a cross sectional view of a photonic apparatus according to another embodiment of the present invention.
Figure 2B:
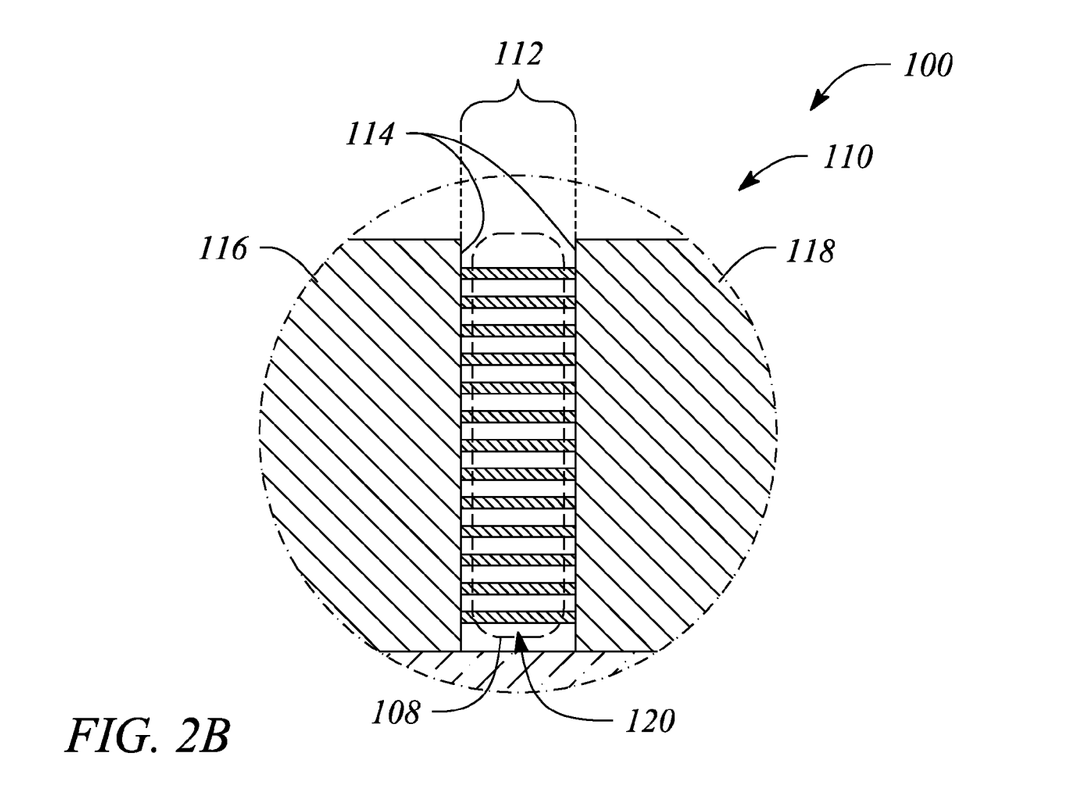
FIG. 2B illustrates a magnified cross sectional view of a portion of the photonic apparatus illustrated in FIG. 2A, according to an embodiment of the present invention.
Figure 2C:
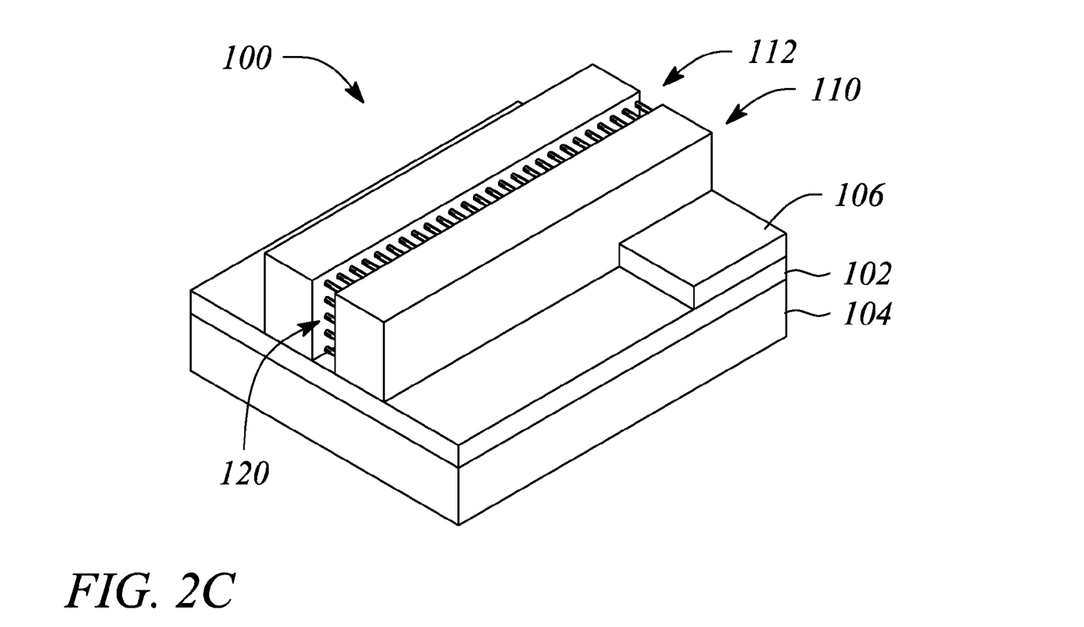
FIG. 2C illustrates a perspective view of a photonic apparatus, according to another embodiment of the present invention.

FIG. 2A illustrates a cross sectional view of a photonic apparatus 100 according to another embodiment of the present invention. As with the photonic apparatus 100 described above with respect to FIGS. 1A and 1B, the embodiment of the photonic apparatus 100 illustrated in FIG. 2A comprises a low-index optical waveguide exemplified by a slot waveguide 110 and a plurality of nanowires 120. However, the slot waveguide 110 illustrated in FIG. 2A is vertically oriented instead of being horizontally oriented. FIG. 2B illustrates a magnified cross sectional view of a portion of the photonic apparatus 100 illustrated in FIG. 2A, according to an embodiment of the present invention. A dashed line 108 in FIG. 2B illustrates an approximate region of high optical field intensity of the optical field confined within the slot waveguide 110. FIG. 2C illustrates a perspective view of a photonic apparatus 100, according to another embodiment of the present invention.

As illustrated in FIGS. 2A-2C, the slot waveguide 110 comprises a pair of walls 114 and a slot region 112 bounded by the pair of walls 114. In some embodiments, the walls 114 are vertical sides of a pair of parallel strips 116, 118 deposited or formed of a semiconductor material on a top surface of the insulator layer 102. For example, parallel strips 116, 118 may be formed from the top layer 106 of semiconductor material of the SOI substrate, as described above for FIGS. 1A-1C. Forming the parallel strips 116, 118 may not require removal of all of the top layer 106 outside of a region of the strips 116, 118. For example, an additional portion of the top layer 106 (e.g., see FIG. 2C) may be employed as an electrode or similar means for accessing one or more of the strips 116, 118.

Since the slot region 112 is oriented generally perpendicular to the substrate surface, the slot waveguide 110 illustrated in FIGS. 2A-2C is referred to as a 'vertically oriented' or 'vertical' slot waveguide 110 to distinguish it from the horizontally oriented slot waveguide 110 illustrated in FIGS. 1A-1C. Otherwise, the slot waveguide 110, the slot region 112, and the walls 114 are essentially similar to the description provided above with respect to FIGS. 1A-1C.

In other embodiments (not illustrated), the walls are walls of a trench or channel formed (e.g., etched) into a layer of semiconductor material, such as the top layer. In such embodiments, the walls do not generally extend above a top surface of the layer, but instead are integral with the layer. As such, no parallel strips are formed from or extend above the top layer to form walls, but instead the trench walls are essentially buried within a thickness of the layer.

Referring again to FIGS. 2A-2C, the plurality of nanowires 120 bridge between the pair of walls 114 that define the slot region 112. That is, the nanowires 120 are connected between the walls 114, the connection being one or both of a mechanical connection and an electrical connection, according to various embodiments. Bridging the slot 112 both preferentially locates the plurality of nanowires 120 in a high optical field region of the slot 112 (e.g., indicated by a dashed line 108 in FIG. 2B) and provides for electrically connecting the plurality of nanowires 120 in an electrical circuit (not illustrated), for example. The plurality of nanowires 120 illustrated in FIGS. 2A-2C is essentially similar to the description provided above. Also, an interstitial space around the nanowires 120 within the slot region 112 may be empty, filled or partially filled with an insulator material as was previously described with reference to FIGS. 1A-1C above.

Figure 3:
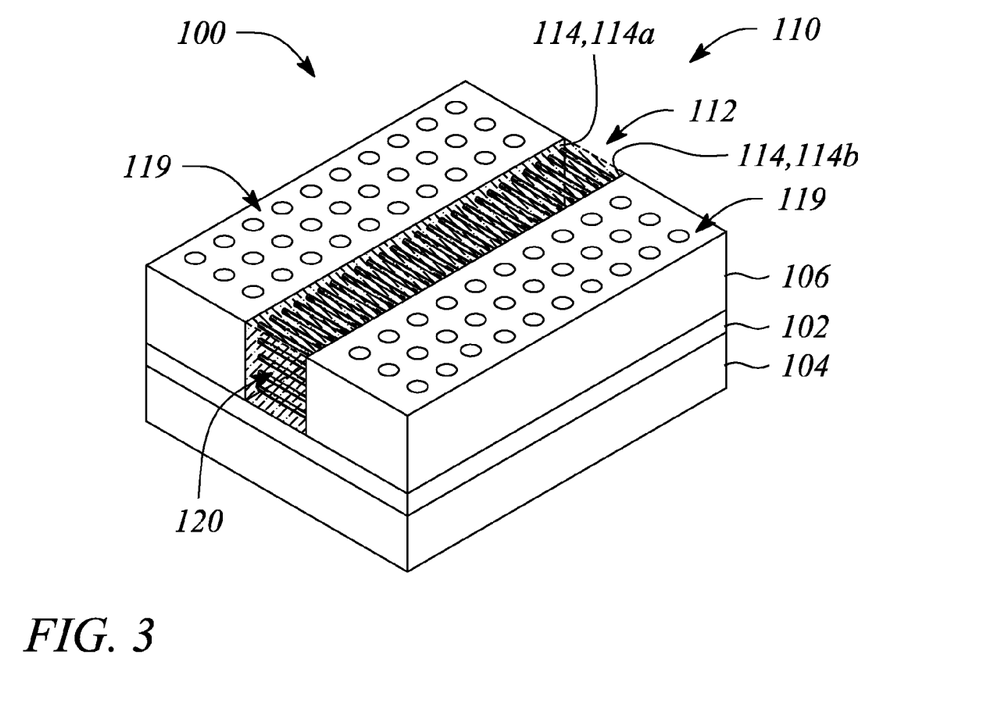
FIG. 3 illustrates a perspective view of a photonic apparatus according to another embodiment of the present invention.

FIG. 3 illustrates a perspective view of a photonic apparatus 100 according to another embodiment of the present invention. In particular, FIG. 3 illustrates an embodiment employing a photonic bandgap (PBG) crystal to confine the optical field. As illustrated, the photonic apparatus 100 comprises a low-index optical waveguide 110 and a plurality of nanowires 120 distributed within the low-index optical waveguide 110. As with previous embodiments, the embodiment of FIG. 3 is illustrated as fabricated on an SOI substrate, by way of example. The SOI substrate comprises an insulator layer 102 overlying a substrate layer 104. A semiconductor layer 106 forms a top layer of the SOI substrate, as was described above with respect to FIGS. 1A-1C. Of course, other substrates besides the exemplary SOI substrate may be employed to manufacture the PBG-based photonic apparatus 100.

The optical waveguide 110 comprises a guide region 112 bounded by a pair of walls 114. The guide region 112 comprises a material that has a lower refractive index than a refractive index of a material of the walls 114. Each of the walls 114, in turn, comprises a boundary edge between the guide region 112 and a PBG crystal region 119. In particular, as illustrated, the PBG crystal region 119 is divided by the guide region 112 into two portions, one portion on either side of the guide region 112. A first wall 114a of the walls 114 is formed at and by a boundary edge between the guide region 112 and a first portion of the PBG region 119. Similarly, a second wall 114b of the walls 114 is formed at and by a boundary edge between the guide region 112 and a second portion of the PBG regions 119.

The PBG crystal regions 119 comprise a structure that provides a photonic bandgap at a frequency or frequencies of operation of the optical waveguide 110. The photonic bandgap impedes and in some embodiments, essentially prevents propagation of the optical field through the PBG crystal region 119. In particular, any of the optical field in the optical guide region 112 that encounters the walls 114 will be largely reflected by the walls 114 (e.g., the action of the PBG crystal region 119) and return back into the optical guide region 112. As such, the PBG crystal region 119 effectively confines the optical field within the optical guide region 112 of the optical waveguide 110.

For example, the PBG crystal regions 119 may be formed from the top layer 106 of the SOI substrate (e.g., an Si layer) by creating an array of holes or vias in the top layer 106, as illustrated in FIG. 3. In particular, the created array of holes may comprise holes that are evenly spaced apart from one another. A spacing between the holes and a diameter of the holes combine to produce the photonic bandgap at the frequency of operation of the optical waveguide 110. Hole size and spacing may be readily determined for a given operational frequency. As such, the PBG crystal regions 119 comprise a layer of semiconductor material and an array of evenly spaced holes, in some embodiments.

The nanowires 120 are distributed within (e.g., bridge across) the guide region 112 between the walls 114 in a manner that is essentially analogous to that described above with respect to the slot waveguide 110 of FIGS. 1A-2C. For example, as illustrated in FIG. 3, the plurality of nanowires 120 may bridge across from the first wall 114a to the second wall 114b. In some embodiments, the optical guide region 112 further comprises an insulating material (indicated by cross hatching in FIG. 3) that essentially fills the interstitial space between the nanowires 120. The insulating material and its relationship to the interstitial space between the nanowires 120 may be essentially similar to that described above with respect to embodiments illustrated in FIGS. 1A-2C.

The guide region 112 may be formed by etching a trench in the Si layer, for example. The trench may be etched either before or after the photonic PBG crystal region 119 is formed by reactive ion etching (RIE), for example. The trench walls become the walls 114. The plurality of nanowires 120 may be grown in situ to bridge across from the first wall 114a to the second wall 114b at the boundary edges of the PBG crystal region 119. In some embodiments, the optical guide region 112 is then filled with the insulator material (e.g., an oxide) through a standard growth or deposition process.

In FIGS. 2A-2C and FIG. 3, the plurality of nanowires 120 are illustrated as horizontally bridging the slot 112. However, the plurality of nanowires 120 may be distributed in other configurations instead of or in addition to that illustrated. For example, the plurality of nanowires may extend vertically from a bottom of the slot or guide region instead of extending from a wall of the trench in some embodiments (not illustrated). Moreover, the plurality of nanowires 120 illustrated in the embodiments in FIGS. 1A-1C, FIGS. 2A-2C and FIG. 3 need not be substantially perpendicular to the walls 114 as is illustrated by way of example therein. Likewise, individual nanowires 120 of the plurality need not be substantially parallel to one another as is also generally illustrated by way of example therein. In some embodiments (not illustrated), the slot may further be filled with an insulator (e.g., optically transmissive oxide, nitride, carbide) surrounding the nanowires.

Furthermore, while described in terms of a low-index optical waveguide (e.g., slot waveguide or PBG-based optical waveguide), other means for confining the optical field in a vicinity of the plurality of nanowires may be employed according to various embodiments (not illustrated). For example, the means for confining may be a strip waveguide that is formed from a material deposited or grown such that the material essentially encapsulates the plurality of nanowires. The strip waveguide confines the optical field (or a mode thereof) in a vicinity of the plurality of nanowires using total internal reflection. Other waveguide structures such as, but not limited to, a ridge waveguide and a reverse ridge waveguide may also be used as an optical field or mode confining means, for example.

According to some embodiments, one or more of the walls 114 and the plurality of nanowires 120 comprise a doped semiconductor material. In particular, the doped semiconductor material is doped to create a semiconductor junction (e.g., a diode junction). A variety of doping configurations may be employed. For example, a p-n semiconductor junction may be created by a particular doping configuration. In another example, a p-i-n semiconductor junction is created by another doping configuration. In other examples, more complex hetero-junctions are created by the doping configuration and the choice of materials in different segments of the nanowires 120. According to various embodiments, the created semiconductor junction may be biased to one of produce photons and absorb photons. Produced photons one or both of create and enhance the optical field, while absorbed photons detect the optical field. The photons are produced or absorbed in a confined portion of the optical field within the confining means. Selection of particular dopants or dopant materials (i.e., one or both of p-dopant materials and n-dopant materials) depends on a particular semiconductor being employed.

Figure 4A:
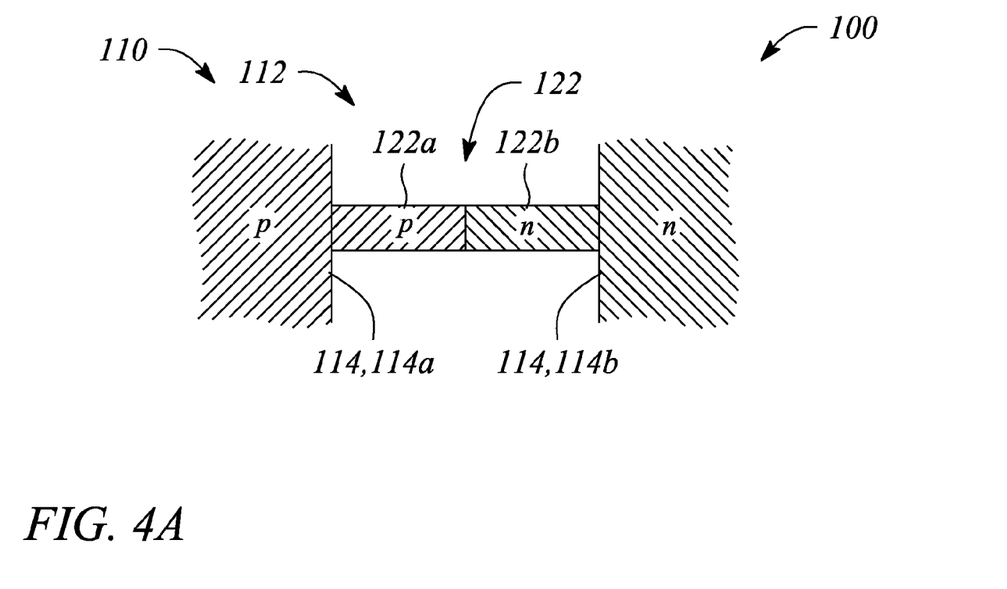
FIG. 4A illustrates a cross-sectional view of an exemplary doping configuration of a photonic apparatus, according to an embodiment of the present invention.

FIG. 4A illustrates a cross-sectional view of an exemplary doping configuration of the photonic apparatus 100, according to an embodiment of the present invention. In particular, FIG. 4A illustrates a magnified cross sectional view of the photonic apparatus 100 depicting the pair of walls 114 (i.e., the first wall 114a and second wall 114b) of a slot waveguide 110 and a selected nanowire 122 of the plurality of nanowires 120 within the slot 112.

As illustrated, the first wall 114a comprises a semiconductor material doped with a p-type dopant material and the nanowire 122 comprises a semiconductor material doped with both a p-type dopant material and an n-type dopant material in adjacent regions along the axial length of the nanowire 122. Specifically, a first axial segment 122a of the nanowire 122 adjacent to the first wall 114a comprises a p-type dopant material while a second axial segment 122b of the nanowire 122 adjacent to the second wall 114b comprises an n-type dopant material. The second wall 114b also comprises semiconductor material doped with an n-type dopant material, as illustrated in FIG. 4A. As illustrated, a p-n junction is formed in the nanowire 122 within the slot region 112.

Figure 4B:
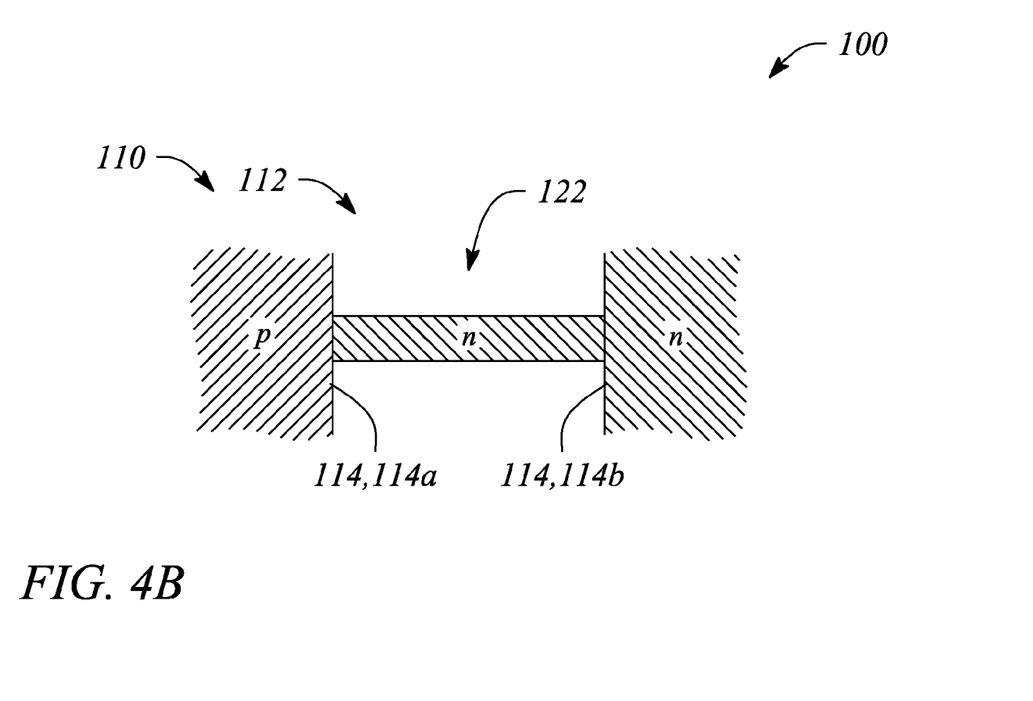
FIG. 4B illustrates a cross-sectional view of another exemplary doping configuration of a photonic apparatus, according to an embodiment of the present invention.

FIG. 4B illustrates a cross-sectional view of another exemplary doping configuration of the photonic apparatus 100, according to an embodiment of the present invention. In the illustrated embodiment, the first wall 114a comprises a semiconductor material doped with a p-type dopant material. The nanowire 122 and second wall 114b each comprise a semiconductor material doped with an n-type dopant material. The p-n junction is formed within the slot 112 at an interface between the nanowire 122 and the first wall 114a.

Figure 4C:
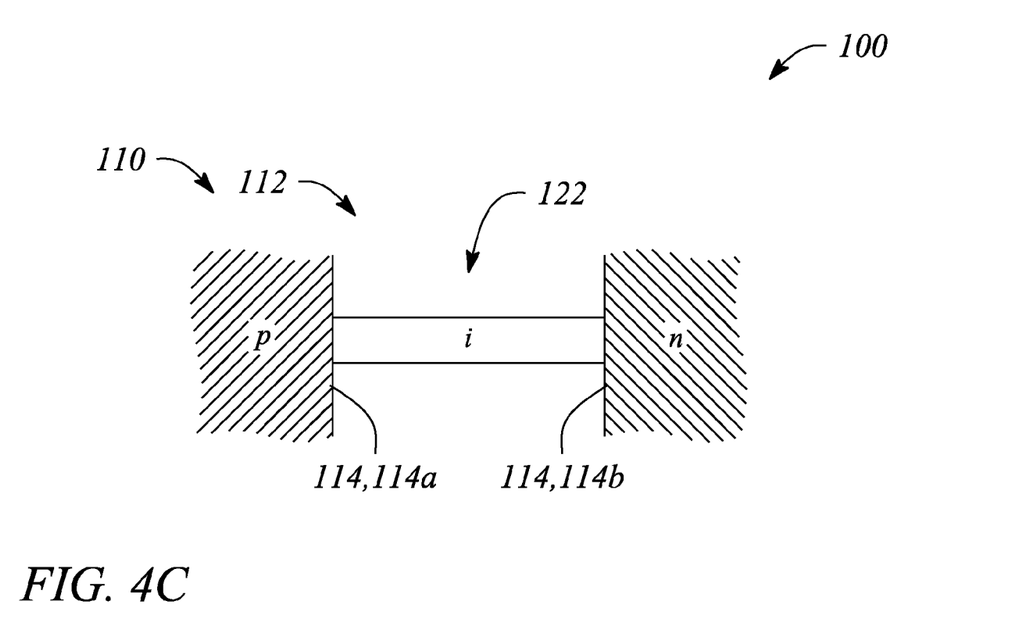
FIG. 4C illustrates a cross-sectional view of another exemplary doping configuration of a photonic apparatus, according to an embodiment of the present invention.

FIG. 4C illustrates a cross-sectional view of another exemplary doping configuration of the photonic apparatus 100, according to an embodiment of the present invention. In particular, FIG. 4C illustrates a doping configuration that yields a p-i-n semiconductor junction. As illustrated, the first wall 114a comprises a semiconductor material doped with a p-type dopant material and the second wall comprises semiconductor material doped with an n-type dopant material. The nanowire 122 within the slot 112 between the walls 114 comprises an intrinsic semiconductor material. A combination of the p-doped first wall 114a, the n-doped second wall 114b and the intrinsic semiconductor of the nanowire 122 produces a p-i-n semiconductor junction.

Figure 4D:
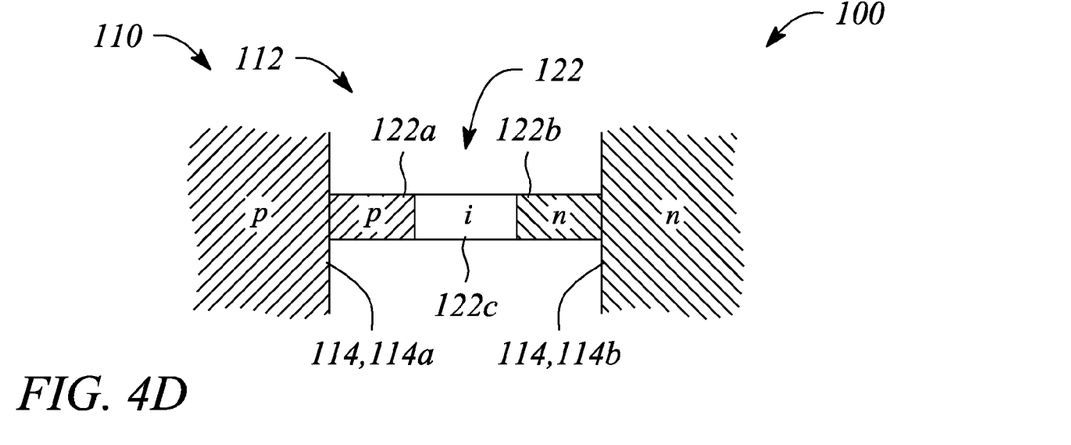
FIG. 4D illustrates a cross-sectional view of yet another exemplary doping configuration of a photonic apparatus, according to an embodiment of the present invention.

FIG. 4D illustrates a cross-sectional view of yet another exemplary doping configuration of the photonic apparatus 100, according to an embodiment of the present invention. As illustrated, the first wall 114a and a first axial segment 122a of the nanowire 122 adjacent to the first wall 114a each comprise a semiconductor material doped with a p-type dopant material. The second wall 114b and a second axial segment 122b of the nanowire 122 adjacent to the second wall 114b each comprise a semiconductor material doped with an n-type dopant material. A third or middle axial segment 122c of the nanowire 122 located between the first axial segment 122a and the second axial segment 122b comprises an intrinsic semiconductor material. As illustrated in FIG. 4D, the p-i-n junction is located in the slot region 112 entirely within the nanowire 122.

In the embodiments illustrated in FIGS. 4A-4D, a relationship between a particular wall 114a, 114b and a particular doping (i.e., p-type or n-type) is exemplary. For example, in some embodiments, the first wall 114a may be doped with an n-type dopant while the second wall 114b is doped with a p-dopant, as an alternative (not illustrated). In some of these embodiments, the first axial segment 122a of the nanowire also may comprise the n-type dopant, while the second axial segment 122b also may comprise the p-type dopant.

Given the discussion with respect to FIGS. 4A-4D, clearly a wide variety of dopant configurations are possible, all of which are within the scope of the various embodiments of the present invention. Moreover, one or both of photon production and photon absorption by semiconductor junctions are known to occur in close association with the junction which is within a region of confined optical field (i.e., confined region), according to the various embodiments. For example, one or both of photon production and photon absorption in p-i-n junctions tend to be most prevalent in and around the intrinsic semiconductor of such a junction. As illustrated in FIGS. 4C and 4D, the intrinsic semiconductor within the nanowire 122 is co-located with the slot 112 of the slot waveguide 110, such that the optical field confining means is provided for the illustrated structures.

Further, a level of doping in each of the walls 114 and in the nanowires 122 or axial segments thereof (e.g., 122a, 122b) may be the same or different, depending on the embodiment. For example, in the embodiment illustrated in FIG. 4D, the first wall 114a may comprise a first quantity of a p-type dopant material while the first axial segment 122a of the nanowire 122 may comprise a second quantity of the p-type dopant that is one of less than, the same as, and more than the first quantity. The variation in dopant level may yield a dopant gradient, for example. In another example of differential doping, the first wall 114a may be heavily doped to yield a p+ region providing a relatively low resistivity within the first wall 114a, while the p-doped region of the nanowires 122 may be less heavily p-doped to yield a p region (as opposed to the p+ region of the more heavily doped first wall 114a). Note that, as used herein, an intrinsic (i.e., 'i') semiconductor refers to an essentially undoped or very lightly doped semiconductor. Additionally, other dopant configurations are also possible including, but not limited to, configurations where there are nanowires comprising multiple segments, one or more of the segments thereof having different doping or where the dopant type of the wall is different from that of an adjacent nanowire segment. Similarly, doping of various layers in the core-shell structure based nanowires 122 may differ from layer to layer.

In addition to differences in doping level and type between the walls 114 and the nanowires 122 or axial segments thereof, the semiconductor materials themselves may differ. For example, the nanowire 122 illustrated in FIG. 4A may comprise a different semiconductor material (e.g., InP or another compound semiconductor material) than a semiconductor material (e.g., Si) of the walls 114. In another example, the nanowire 122 may comprise a plurality of axial segments of different semiconductor materials. The nanowire 122 illustrated in FIG. 4D may comprise GaAlAs in the first and second axial segments 122a, 122b and may comprise GaAs in the middle axial segment 122c, for example. Such semiconductor junctions formed from a number of segments of different materials are often referred to as 'heterostructures' or heterostructure diodes. Many applications may employ and derived benefit from the use of such heterostructures (e.g., heterostructure laser diodes, double heterostructure laser diodes, quantum well laser diodes, and separate confinement heterostructure quantum well laser diodes). The various embodiments of the present invention embrace all such heterostructures and further provide for co-location of a photoactive portion of the heterostructure with a high optical field region of the confining means (e.g., the slot waveguide 110). Moreover, various embodiments of the present invention embrace nanowires 120 comprising a core-shell structure.

According to some embodiments, the photonic apparatus 100 further comprises a resonant cavity. In particular, the resonant cavity may comprise one or more segments of the slot waveguide 110 with the plurality of nanowires 120 distributed within, as described above with respect to FIGS. 1A-1B, 2A-2B, and 3A-3D. For example, the photonic apparatus 100 may be a laser and the resonant cavity may provide a resonance employed to produce 'lasing' by the plurality of nanowires 120. In other embodiments the photonic structure may be a detector or a modulator and the resonant cavity is used to enhance absorption.

Figure 5:
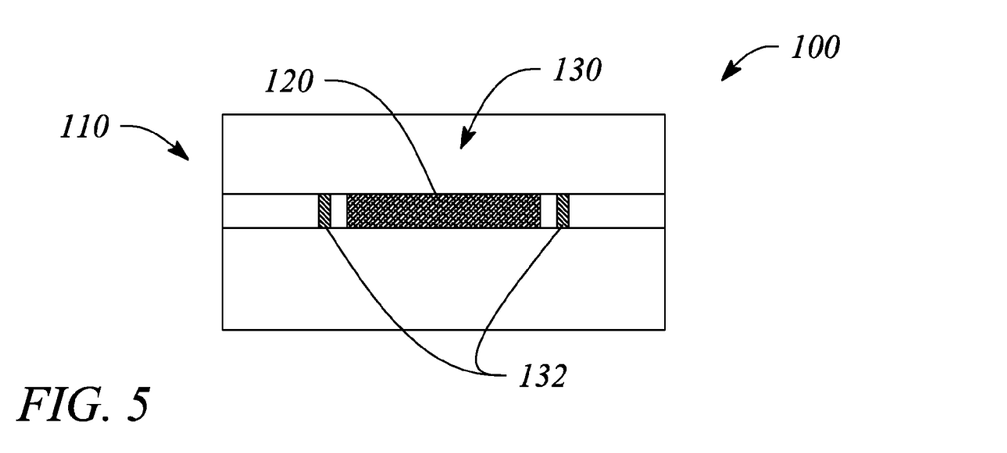
FIG. 5 illustrates a top view of a photonic apparatus comprising a resonant cavity, according to an embodiment of the present invention.

FIG. 5 illustrates a top view of a photonic apparatus 100 comprising a resonant cavity 130 according to an embodiment of the present invention. In particular, as illustrated in FIG. 5, the resonant cavity 130 comprises a segment of the vertical-oriented slot waveguide 110 of a predetermined length. The plurality of nanowires 120 are distributed between the walls of the slot waveguide 110 along the entire length of the segment, as illustrated. For simplicity herein, the plurality of nanowires 120 is depicted as a continuous shaded area 120 within the slot waveguide 110 in FIG. 5 (as well as FIGS. 6A, 6B, 7A and 7B described below). In other embodiments (not illustrated), the plurality of nanowires 120 are distributed along only a portion of the segment.

The resonant cavity 130 further comprises a pair of mirrors 132, one mirror located at each end of the segment of the slot waveguide 110. In particular, a first mirror 132 of the pair is located at a first end of the segment and a second mirror 132 of the pair is located at a second end of the segment. An optical signal comprising the optical field within the slot waveguide 110 propagates back and forth between the pair of mirrors 132. A time that the optical signal takes to propagate back and forth (i.e., in a round trip) determines a resonant frequency of the resonant cavity. The resonant cavity 130 illustrated in FIG. 5 is sometimes referred to as a Fabry-Perot cavity.

Figure 6A:
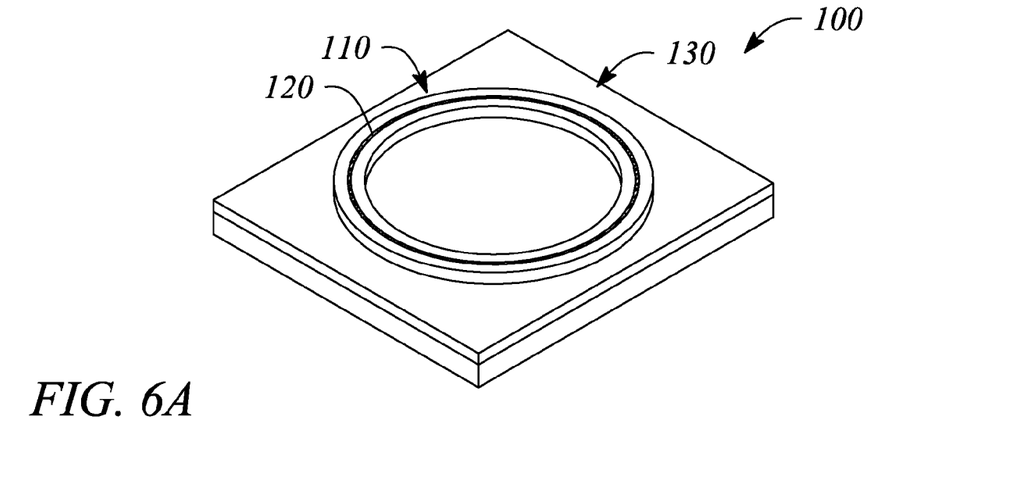
FIG. 6A illustrates a perspective view of a photonic apparatus comprising a resonant cavity, according to another embodiment of the present invention.

FIG. 6A illustrates a perspective view of a photonic apparatus 100 comprising a resonant cavity 130 according to another embodiment of the present invention. In particular, the resonant cavity 130 illustrated in FIG. 6A comprises a segment of the slot waveguide 110 with the plurality of nanowires 120 where the segment is configured as a ring or closed loop. A resonant frequency of the resonant cavity 130 illustrated in FIG. 6A is observed when the length of the optical path around the closed loop is equal to half the wavelength of the optical signal. In some embodiments, the path length may be an integer multiple of half the wavelength of the optical signal such that there are one or more resonant frequencies. Input/output port(s) are omitted from that illustrated in FIG. 6A for illustrative clarity.

Figure 6B:
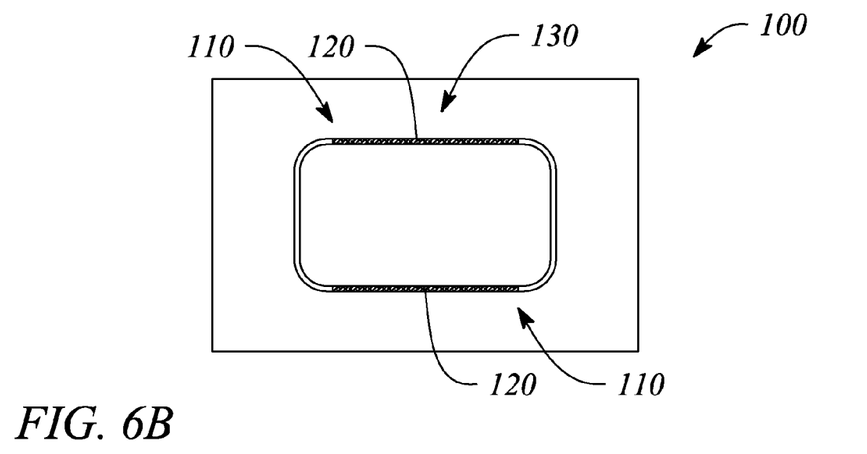
FIG. 6B illustrates a top view of a photonic apparatus comprising a resonant cavity according to another embodiment of the present invention.

FIG. 6B illustrates a top view of a photonic apparatus 100 comprising a resonant cavity 130 according to yet another embodiment of the present invention. In particular, the resonant cavity 130 illustrated in FIG. 6B comprises a plurality of linear segments of the slot waveguide 110 having the plurality of nanowires 120, the linear segments arranged as a closed loop. As illustrated, the linear segments are interconnected at their respective ends by curved sections of a slot waveguide. In some embodiments (not illustrated), the curved sections may comprise the slot waveguide 110 so that plurality of nanowires 120 is distributed along an entire length of the closed path of the resonant cavity 130. In other embodiments, the plurality of nanowires 120 is distributed in only the linear segments. In yet other embodiments (not illustrated), the plurality of nanowires 120 is distributed in only a portion of one or more of the linear segments and the curved sections. The resonant cavity illustrated in FIG. 6B is sometimes referred to as a 'race track' resonator. A resonant cavity 130 may comprise three, five or more segments of the slot waveguide 110 instead of the four linear segments illustrated in the embodiment of FIG. 6B. Input/output port(s) are omitted from that illustrated in FIG. 6B for illustrative clarity.

The resonant cavities 130 illustrated in FIGS. 6A and 6B provide a resonant structure comprising one or more bent or curved sections of optical waveguide (e.g., slot waveguide 110) to produce the closed loop. In some embodiments, the resonant cavity 130 comprising a plurality of segments of optical waveguide may employ only linear segments. In such embodiments, mirrors may be used to interconnect and arrange the linear segments into a closed loop.

Figure 7A:
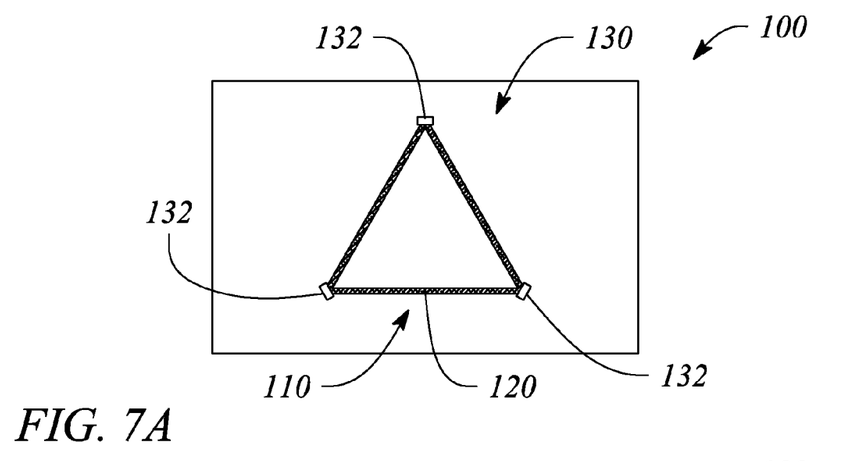
FIG. 7A illustrates a top view of a photonic apparatus comprising a resonant cavity that employs mirrors, according to an embodiment of the present invention.

FIG. 7A illustrates a top view of a photonic apparatus 100 comprising a resonant cavity 130 that employs mirrors 132, according to an embodiment of the present invention. In particular, FIG. 7A illustrates a resonant cavity 130 comprising three substantially straight segments of the slot waveguide 110 arranged in a triangular closed loop. Mirrors 132 are located at respective first and second ends of the straight segments, where each mirror 132 interconnects two segments of slot waveguide 110. In some embodiments, the plurality of nanowires 120 are distributed along each of the slot waveguide 110 segments. In other embodiments (not illustrated), the plurality of nanowires 120 are confined to just a portion of one or more of the segments of slot waveguide 110.

In some embodiments, a location and orientation of the slot waveguide 110 may be selected to correspond with a (111)-plane of a semiconductor material of a substrate being used to fabricate the photonic apparatus 100. As such, growth of the plurality of nanowires 120 within the slot waveguide 110 may be facilitated by the tendency of nanowires to grow perpendicular to a (111)-plane of a semiconductor material. In other words, the plurality of nanowires 120 grown in such a structure would tend to be perpendicular to a propagation axis of the slot waveguide 110.

Figure 7B:
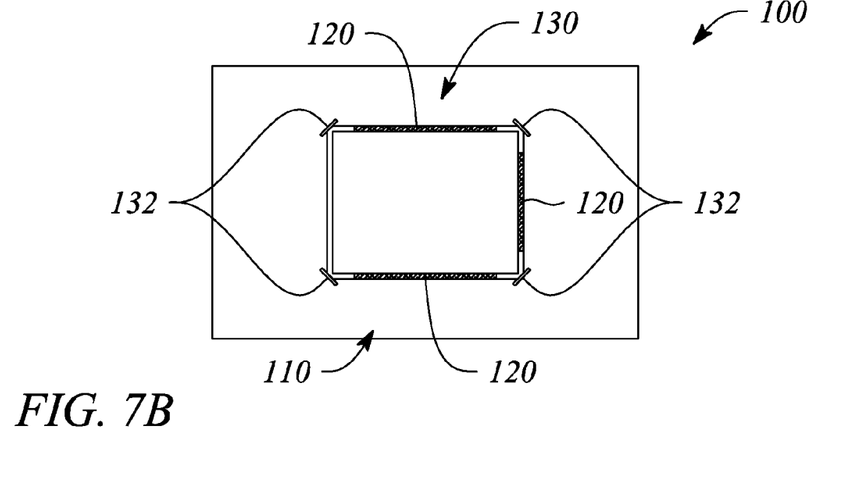
FIG. 7B illustrates a top view of a photonic apparatus comprising a resonant cavity that employs mirrors, according to another embodiment of the present invention.

FIG. 7B illustrates a top view of a photonic apparatus 100 comprising a resonant cavity 130 that employs mirrors 132, according to another embodiment of the present invention. As illustrated, the resonant cavity 130 comprises four substantially straight segments of slot waveguide 110 and four mirrors 132. A mirror 132 interconnects each pair of the slot waveguide 110 segments to form a closed ring-shaped optical path. Input/output port(s) are omitted from that illustrated in FIGS. 7A and 7B for illustrative clarity.

Figure 8:
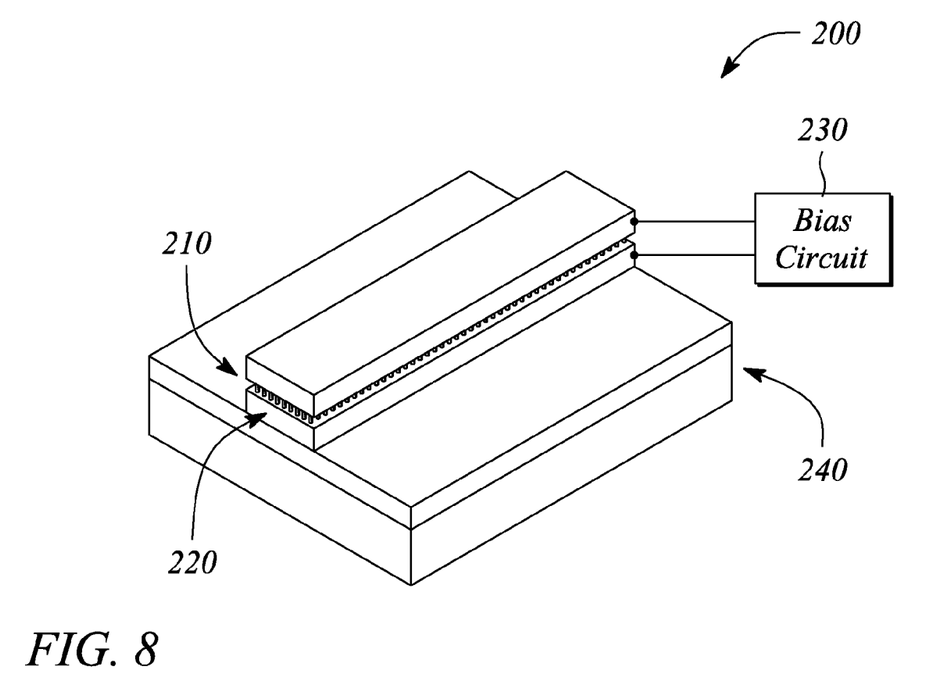
FIG. 8 illustrates a perspective view of an embodiment of a photonic apparatus in a photonic system, according to an embodiment of the present invention.

FIG. 8 illustrates a perspective view of a photonic apparatus in a photonic system 200, according to an embodiment of the present invention. As illustrated in FIG. 8, the photonic system 200 comprises a low-index optical waveguide 210 (e.g., a low-index slot waveguide 210) that confines an optical field. The slot waveguide 210 illustrated in FIG. 8 is a horizontal-oriented slot waveguide 210. In another embodiment (not illustrated), the slot waveguide is a vertical-oriented slot waveguide, similar to the slot waveguide 110 described above and illustrated in FIGS. 2A-2C. In some embodiments, the slot waveguide 210 comprises a plurality of segments. In other embodiments, the slot waveguide 210 comprises a single segment. In some embodiments, the one or more segments of the slot waveguide 210 are arranged to form a resonant cavity (not illustrated). The resonant cavity may comprise one of the embodiments described above with respect to FIGS. 5, 6A-6B and 7A-7B, for example.

In some embodiments, the walls of the slot waveguide 210 may comprise a semiconductor material such as, but not limited to, Si, GaAs, GaAlAs, and InP. In some embodiments, the slot waveguide 210 is essentially similar to the slot waveguide 110 described above with respect to the photonic apparatus 100.

The photonic system 200 further comprises a plurality of nanowires 220. The plurality of nanowires 220 are distributed within a confined optical field region of the slot waveguide 210. In some embodiments, the plurality of nanowires 220 is distributed along an entire length of the slot waveguide 210. In other embodiments, the plurality of nanowires 220 is confined to a limited portion of the slot waveguide 210. In some embodiments, the plurality of nanowires 220 comprises a semiconductor material. In some of such embodiments, the semiconductor material of the plurality of nanowires 220 may be the same as a semiconductor material of the slot waveguide 210 while in other embodiments, the semiconductor material of one or more of the plurality of nanowires 220, an axial segment of the nanowires 220, and a layer of core-shell structured nanowires 220 may be different from a semiconductor material of the slot waveguide 210. In some embodiments, the plurality of nanowires 220 is essentially similar to the plurality of nanowires 120 described above with respect to the photonic apparatus 100. Moreover, the confined optical field region of the slot waveguide 210 is essentially similar to the slot 112 (i.e., slot or guide region 112) of the photonic apparatus 100.

The photonic system 200 further comprises a semiconductor junction in one or both of the slot waveguide 210 and the plurality of nanowires 220. In some embodiments, the plurality of nanowires 220 provides the semiconductor junction. For example, the nanowires 220 may be doped with one or both of an n-type dopant and a p-type dopant to form one of a p-n semiconductor junction and a p-i-n semiconductor junction within the nanowires 220. In other embodiments, the semiconductor junction comprises a combination of one or more elements of the slot waveguide 210 and the plurality of nanowires 220. For example, the semiconductor junction may comprise an n-doped semiconductor material of a wall of the slot waveguide 210 in contact with a p-doped semiconductor material of the plurality of nanowires 220. In various embodiments, the semiconductor junction may assume the form of any of the junctions described above with respect to FIGS. 4A-4D, for example.

The photonic system 200 further comprises a circuit. In some embodiments, the circuit is electrically connected to opposite sides of the semiconductor junction (e.g., via the opposite walls). In some embodiments, the circuit is a bias circuit 230 (as illustrated). The bias circuit 230 electrically biases the plurality of nanowires 220. In particular, the bias circuit 230 facilitates one or more of the production, enhancement, modulation and detection of an optical field by electrically biasing the plurality of nanowires. In some embodiments, the bias circuit 230 applies an electrical bias to the semiconductor junction formed by one or both of the plurality of nanowires 220 and the slot waveguide 210. In some embodiments, the biased semiconductor junction may provide an electrical pump to one or more of produce the optical field, enhance the optical field and modulate the optical field. For example, the bias circuit 230 may facilitate the use of the plurality of nanowires 220 within the slot waveguide 210 as a laser. In other embodiments, the biased semiconductor junction facilitates detecting and/or measuring the optical field. For example, the bias circuit 230 may facilitate the use of the plurality of nanowires 220 within the slot waveguide 210 as a detector or sensor.

In some embodiments, the circuit comprises a detection circuit (not illustrated). In some embodiments, the detection circuit is a photovoltaic circuit that does not actively apply a bias to the semiconductor junction. Instead, the photovoltaic circuit acts as collector of electrons produced by the semiconductor junction. The collected electrons may further be detected by the photovoltaic circuit. For example, the semiconductor junction may act as a passive optical detector generating electrons by absorbing photons from the optical field. The photovoltaic circuit receives the generated electrons as a means of detecting the optical field. In other embodiments, the circuit either comprises or may function as both a bias circuit and a detection circuit.

In some embodiments of the photonic system 200, the slot waveguide 210 comprises a first strip of semiconductor material and a second strip of semiconductor material. The first strip is substantially parallel to the second strip. Further, the first strip is spaced apart from the second strip to form a slot between the strips. The plurality of nanowires 220 connects the first strip to the second strip, according to some embodiments. In some embodiments, an insulator material (e.g., an oxide, a nitride or a carbide) fills all or a portion of the slot as was described previously with respect to the photonic apparatus 100. The insulator material filling the slot may further support the second strip above the first strip, in some embodiments.

According to various embodiments, the slot waveguide 210 may be either horizontally oriented or vertically oriented. For example, the first and second strips of the slot waveguide 210 illustrated in FIG. 8 are oriented horizontally relative to each other and a substrate 240 that supports the slot waveguide 210. As such, the illustrated slot waveguide 210 is horizontally oriented. For the vertical-oriented slot waveguide embodiment (not illustrated in FIG. 8), the first strip and the second strip are oriented vertically relative to each other and the waveguide substrate 240. Either the horizontally oriented or the vertically oriented slot waveguide 210 embodiments may comprise a slot wherein an interstitial space between the nanowires is one of essentially filled with, partially filled with, or essentially empty of the insulator material.

In some embodiments, the bias circuit 230 is connected to the first strip and the second strip to bias the plurality of nanowires 220. In other embodiments, the plurality of nanowires 220 are located between but do not bridge across or connect the first strip and the second strip. In such embodiments, the bias circuit may connect directly to opposite ends of the plurality of nanowires 220, for example.

Thus, there have been described embodiments of a photonic apparatus and a photonic system that employ a low-index waveguide and a plurality of nanowires to one or more of produce, enhance, modulate and detect an optical field confined by the waveguide. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A photonic apparatus comprising:
   a low-index optical waveguide having a confined region; and
   a plurality of nanowires, the nanowires being distributed within the confined region,
   wherein the plurality of nanowires is distributed to collectively one or more of produce, enhance, modulate and detect an optical field, the low-index optical waveguide confining the optical field in the confined region.

2. The photonic apparatus of claim 1, wherein the confined region is between spaced apart walls of the low-index optical waveguide, and wherein the nanowires comprise first ends connected to a first wall of the confined region and second ends connected to a second wall of the confined region, the nanowires bridging across the confined region from the first wall to the second wall.

3. The photonic apparatus of claim 2, wherein the first wall, the second wall and the plurality of nanowires comprise one or more semiconductor materials doped to create a semiconductor junction.

4. The photonic apparatus of claim 3, wherein a semiconductor material of the plurality of nanowires differs from a semiconductor material of one or both of the first wall and the second wall.

5. The photonic apparatus of claim 4, wherein the semiconductor material of the plurality of nanowires comprises a compound semiconductor.

6. The photonic apparatus of claim 3, wherein the semiconductor junction comprises a p-n junction, the p-n junction being formed by the doped semiconductor materials one or more of within the nanowires, at the connection between the nanowires and the first wall and at the connection between the nanowires and the second wall.

7. The photonic apparatus of claim 2, wherein the first wall comprises a semiconductor material doped with a p-type dopant, the second wall comprising a semiconductor material doped with an n-type dopant, such that a p-i-n semiconductor junction is formed with the nanowires.

8. The photonic apparatus of claim 1, further comprising a resonant cavity, either all of the resonant cavity or a portion of the resonant cavity comprising the low-index optical waveguide and the plurality of nanowires, wherein the photonic apparatus is a laser, the nanowires interacting with the optical field to one of both of produce and enhance the optical field of the laser.

9. The photonic apparatus of claim 1, further comprising a resonant cavity, either all of the resonant cavity or a portion of the resonant cavity comprising the low-index optical waveguide and the plurality of nanowires, wherein the photonic apparatus is either a modulator or a detector, the nanowires interacting with the optical field to one or both of absorb and detect the optical field.

10. The photonic apparatus of claim 1, further comprising a resonant cavity, wherein the resonant cavity comprises:
a segment of the low-index optical waveguide with the distributed plurality of nanowires, the low-index optical waveguide comprising one of a slot waveguide and a photonic bandgap-based optical waveguide;
a first mirror at a first end of the segment; and
a second mirror at a second end of the segment.

11. The photonic apparatus of claim 1, further comprising a resonant cavity, wherein the resonant cavity comprises one or more segments of the low-index optical waveguide with the distributed plurality of nanowires, the one or more segments being arranged in a closed loop.

12. The photonic apparatus of claim 1, further comprising a resonant cavity, wherein the resonant cavity comprises:
more than one segment of the low-index optical waveguide, the plurality of nanowires being distributed in at least one segment; and
a plurality of mirrors, a number of mirrors in the plurality equaling a number of segments of the low-index optical waveguide,
wherein a mirror of the plurality of mirrors connects segment ends of respective successive pairs of the segments of the low-index optical waveguide.

13. The photonic apparatus of claim 1 employed in a photonic system, the photonic system comprising:
the photonic apparatus; and
a bias circuit that electrically biases the plurality of nanowires distributed within the low-index optical waveguide,
wherein the bias circuit facilitates one of the production, enhancement and modulation of the optical field by the nanowires or the detection of the optical field by the nanowires.

14. The photonic apparatus of claim 1, wherein the low-index optical waveguide comprises:
a first strip, wherein the first strip is a portion of a semiconductor layer of a semiconductor on insulator (SOI) substrate, the semiconductor layer overlying an insulator layer of the SOI substrate; and
a second strip spaced apart from and overlying the first strip, the second strip being co-linear with the first strip, the second strip comprising a semiconductor material.

15. A photonic system comprising:
a low-index optical waveguide having a confined region, the low-index optical waveguide confining an optical field;
a plurality of nanowires distributed within the confined region of the low-index optical waveguide; and
a circuit that one or more of electrically biases the plurality of nanowires and collects electrons produced in the plurality of nanowires,
wherein the circuit facilitates one or more of production, enhancement, modulation and detection of the optical field by the plurality of nanowires.

16. The photonic system of claim 15, further comprising a resonant cavity, the resonant cavity comprising one or more segments of the low-index optical waveguide and the plurality of nanowires.

17. The photonic system of claim 15, wherein the low-index optical waveguide comprises a slot waveguide, the slot waveguide comprising:
a first strip of a semiconductor material; and
a second strip of a semiconductor material, the second strip being both spaced apart from and co-linear with the first strip,
wherein the plurality of nanowires connects the first strip to the second strip, and wherein the circuit is connected to the first strip and the second strip.

18. The photonic system of claim 15, wherein either the plurality of nanowires or a combination of the plurality of nanowires and one or both walls of the low-index optical waveguide comprises a semiconductor junction, the circuit either applying an electrical bias across the semiconductor junction or collecting electrons produced in the semiconductor junction.

19. A photonic apparatus comprising:
a plurality of nanowires, the nanowires comprising a semiconductor material; and
means for confining an optical field,
wherein the means for confining an optical field confine an optical mode of the optical field in a vicinity of the plurality of nanowires.

20. The photonic apparatus of claim 19, wherein the means for confining an optical field comprises a low-index optical waveguide having walls bounding an optical guide region, and wherein the plurality of nanowires is distributed within the optical guide region of the low-index optical waveguide.

21. The photonic apparatus of claim 19, wherein the means for confining comprises a slot waveguide, the plurality of nanowires being distributed in a slot of the slot waveguide, the slot waveguide having walls comprising silicon, and, wherein the plurality of nanowires comprises a III-V compound semiconductor material.

* * * * *

UNITED STATES PATENT AND TRADEMARK OFFICE
CERTIFICATE OF CORRECTION

PATENT NO. : 7,474,811 B1 Page 1 of 1
APPLICATION NO. : 11/856007
DATED : January 6, 2009
INVENTOR(S) : Nathaniel J. Quitoriano et al.

It is certified that error appears in the above-identified patent and that said Letters Patent is hereby corrected as shown below:

In column 19, line 30, in Claim 8, delete "one of" and insert -- one or --, therefor.

Signed and Sealed this

Tenth Day of November, 2009

David J. Kappos
*Director of the United States Patent and Trademark Office*